(12) United States Patent
Mangrum et al.

(10) Patent No.: US 7,588,951 B2
(45) Date of Patent: Sep. 15, 2009

(54) METHOD OF PACKAGING A SEMICONDUCTOR DEVICE AND A PREFABRICATED CONNECTOR

(75) Inventors: Marc A. Mangrum, Manchaca, TX (US); Kenneth R. Burch, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 219 days.

(21) Appl. No.: 11/561,063

(22) Filed: Nov. 17, 2006

(65) Prior Publication Data
US 2008/0119015 A1    May 22, 2008

(51) Int. Cl.
*H01L 21/00*    (2006.01)
(52) U.S. Cl. .............. 438/25; 438/26; 438/42; 438/43; 438/44; 438/51; 438/55; 438/64; 438/83; 438/98
(58) Field of Classification Search .......... 438/25, 438/26, 42, 43, 44, 51, 55, 64, 83, 98
See application file for complete search history.

(56) References Cited

U.S. PATENT DOCUMENTS

| | | | | |
|---|---|---|---|---|
| 5,948,533 | A * | 9/1999 | Gallagher et al. | 428/418 |
| 6,400,573 | B1 | 6/2002 | Mowatt et al. | |
| 6,797,145 | B2 * | 9/2004 | Kosowsky | 205/221 |
| 6,838,776 | B2 | 1/2005 | Leal et al. | |
| 6,921,975 | B2 | 7/2005 | Leal et al. | |
| 7,015,075 | B2 | 3/2006 | Fay et al. | |
| 7,498,196 | B2 | 3/2009 | Lee et al. | |
| 2002/0031950 | A1 * | 3/2002 | Doutrich et al. | 439/625 |
| 2004/0207077 | A1 * | 10/2004 | Leal et al. | 257/723 |
| 2005/0056551 | A1 | 3/2005 | White et al. | |
| 2005/0242425 | A1 | 11/2005 | Leal et al. | |
| 2006/0154496 | A1 * | 7/2006 | Imamura et al. | 439/66 |
| 2006/0157852 | A1 * | 7/2006 | Hsu et al. | 257/750 |
| 2006/0263930 | A1 | 11/2006 | Ito | |
| 2007/0158787 | A1 * | 7/2007 | Chanchani | 257/619 |

OTHER PUBLICATIONS

Freescale Semiconductor, Inc., Redistributed Chip Package (RCP) Technology, 6 pages, 2005.
International Search Report for correlating PCT Patent Application No. PCT/US 07/79714 dated Mar. 27, 2008.
Office Action issued by the US Patent Office on May 13, 2009 for a related U.S. Appl. No. 11/561,232.
Office Action issued by the US Patent Office on Mar. 24, 2009 for a related U.S. Appl. No. 11/561,234.

* cited by examiner

*Primary Examiner*—Thanh V Pham
(74) *Attorney, Agent, or Firm*—James L. Clingan, Jr.; Kim-Marie Vo

(57) ABSTRACT

A method of packaging a first device having a first major surface and a second major surface includes forming a first layer over a second major surface of the first device and around sides of the first device and leaving the first major surface of the first device exposed, wherein the first layer is selected from the group consisting of an encapsulant and a polymer; forming a first dielectric layer over the first major surface of the first device, forming a via in the first dielectric layer, forming a seed layer within the via and over a portion of the first dielectric layer, physically coupling a connector to the seed layer, and plating a conductive material over the seed layer to form a first interconnect in the first via and over a portion of the first dielectric layer.

9 Claims, 10 Drawing Sheets

//METHOD OF PACKAGING A SEMICONDUCTOR DEVICE AND A PREFABRICATED CONNECTOR

RELATED APPLICATIONS

This application is related to the following four applications assigned to the assignee hereof, by the same inventors hereof, and filed on even date herewith:

1. U.S. patent application Ser. No. 11/561,241, titled METHOD OF PACKAGING A DEVICE USING A DIELECTRIC LAYER;

2. U.S. patent application Ser. No. 11/561,234, titled METHOD OF PACKAGING A DEVICE HAVING A MULTI-CONTACT ELASTOMER CONNECTOR CONTACT AREA AND DEVICE THEREOF;

3. U.S. patent application Ser. No. 11/561,232, titled METHOD OF PACKAGING A DEVICE HAVING A TANGIBLE ELEMENT AND DEVICE THEREOF; and 4. U.S. patent application Ser. No. 11/561,211, titled METHOD OF PACKAGING A DEVICE HAVING A KEYPAD SWITCH POINT.

FIELD OF THE INVENTION

This invention relates generally to semiconductor devices, and more specifically, to packaging a semiconductor device with a prefabricated connector.

BACKGROUND

Typically, devices are packaged for protection during operation. These packaged devices are placed on a printed circuit board (PCB) with other devices. The PCB with the devices is used in products, such as computers or cellular phones. Since there is a desire to decrease the size of products, such as computers and cellular phones, there is a need to decrease the size of the PCB and the package device without sacrificing functionality. In many cases, additional functionality is desired while also providing ease of connectivity. For example, it may be desirable to provide connection to a semiconductor device that requires minimal, if any, manufacturing. Therefore, a need exists for a packaging method that can provide ease of connection while having at least some other benefits of semiconductor packaging.

BRIEF DESCRIPTION OF THE DRAWINGS

The present invention is illustrated by way of example and is not limited by the accompanying figures, in which like references indicate similar elements. Skilled artisans appreciate that elements in the figures are illustrated for simplicity and clarity and have not necessarily been drawn to scale.

DETAILED DESCRIPTION OF THE DRAWINGS

In one aspect a semiconductor device and a prefabricated connector are formed together in a single package. A pin of a prefabricated connector is placed in proximity to a seed layer and a subsequent plating step causes the plating to be in physical and electrical contact with the pin. The plating is also in electrical contact with the semiconductor device so that electrical contact is made between the pin and the semiconductor device. A subsequent deposition of an insulating layer provides physical support in holding the connector and the semiconductor device together.

Figure 1:
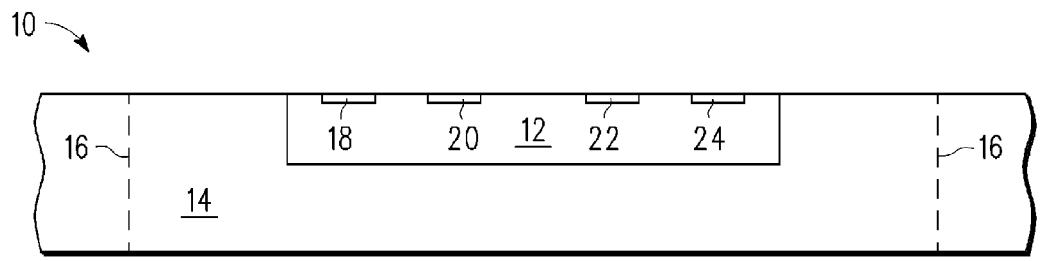
FIG. 1 is a cross-section of a work piece having a semiconductor device at a stage in processing according to one embodiment.
Figure 10:
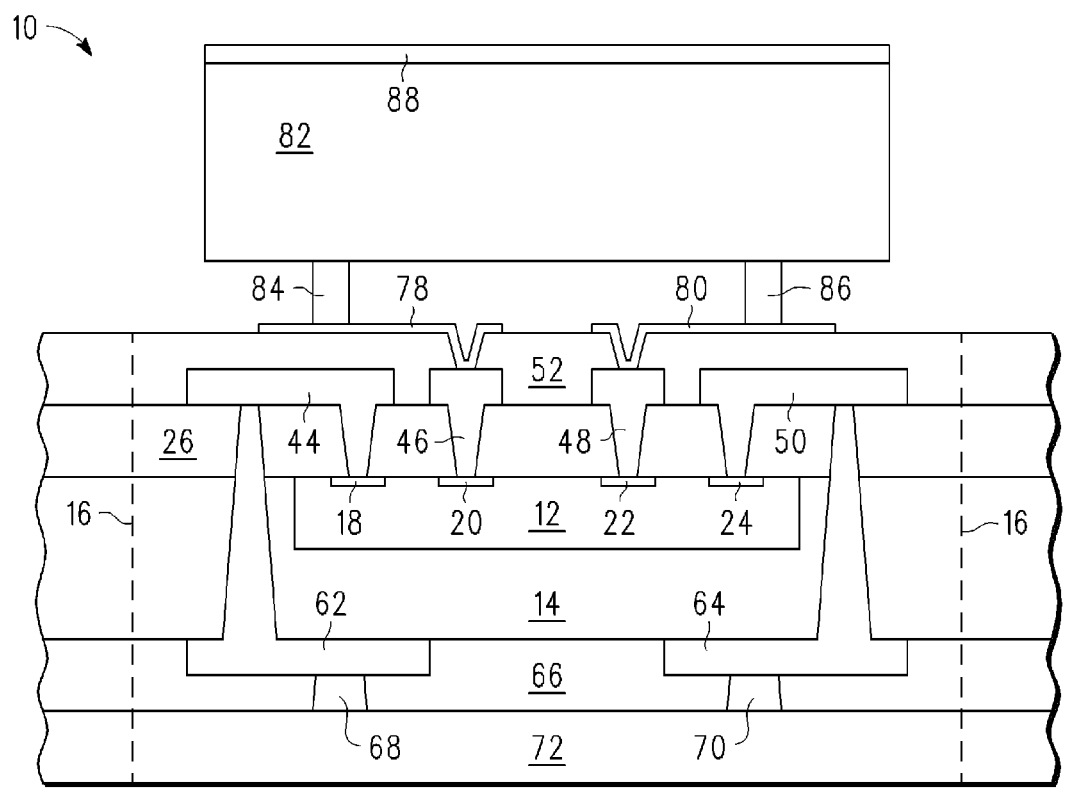
FIG. 10 is a cross-section of the work piece of FIG. 9 at a subsequent stage in processing.

Shown in FIG. 1 is a work piece 10 comprising a semiconductor device 12 surrounded on all but a top side by an insulating layer 14. Also shown, by dotted lines 16, is a singulation boundary that defines a singulation area. This shows where work piece 10 will be separated from other work pieces that may be the same or different from work piece 10. The overall structure of FIG. 10 is for a process for building up a package from a plurality of singulated die that are placed in a container. The side with contacts is taped to protect the contacts. In a contact down configuration, a material is flowed over the plurality of die. After the material is cured, the plurality of die as a unit held together by the material are removed from the container and the tape is removed. Subsequent steps of deposition of insulating and conductive layers forms the packaged integrated circuit. The material flowed to form insulating layer 14 is preferably a polymer in the example of FIG. 1 but another material such as an epoxy may be used. Polymer is preferable in this case because vias through it will be formed. If vias are not to be formed through it, then the epoxy is probably preferable because it is likely to be more cost effective. For this type of package, a polymer is generally preferable for the insulating layers that have vias and epoxy is generally preferable for the insulating layers that do not have vias. The layers with vias typically are about 20 microns. The thicknesses can also be more or less than that amount and especially can be made significantly greater as desired. Semiconductor device 12 has contacts 18, 20, 22, and 24 exposed on one major surface (top surface). The other major surface (bottom surface) has insulating layer 14 covering it. Insulating layer 14 surrounds the other sides.

Figure 2:
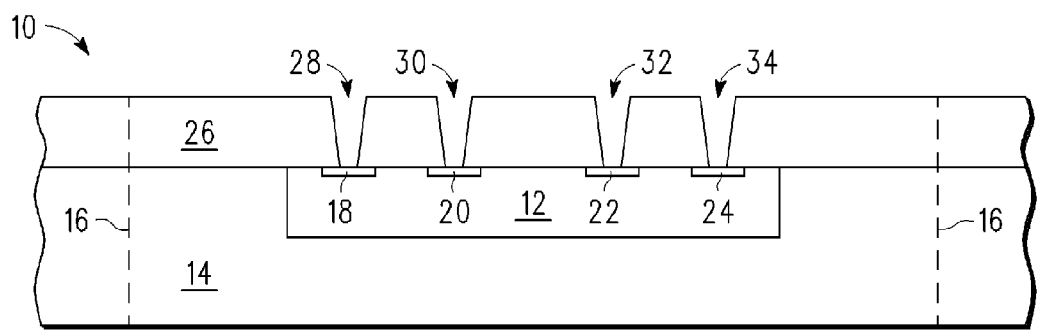
FIG. 2 is a cross-section of the work piece of FIG. 1 at a subsequent stage in processing.

Shown in FIG. 2 is work piece 10 after depositing an insulating layer 26 over the top surface of semiconductor device 12 and forming vias 28, 30, 32, and 34 through insulating layer to expose contacts 18, 20, 22, and 24, respectively.

Figure 3:
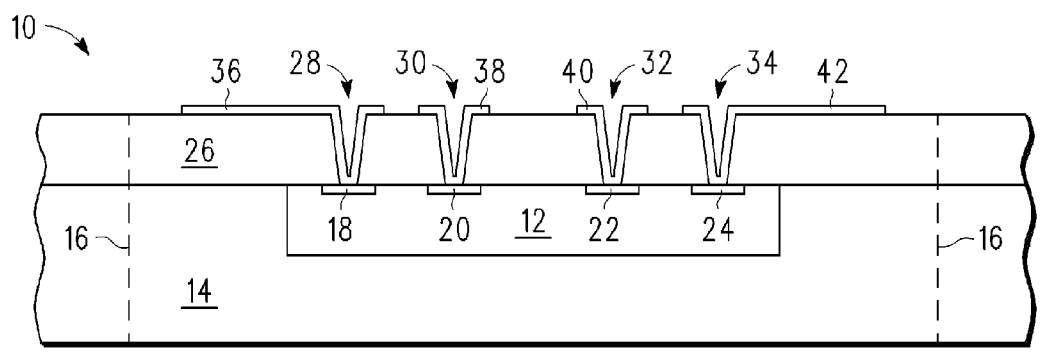
FIG. 3 is a cross-section of the work piece of FIG. 2 at a subsequent stage in processing.

Shown in FIG. 3 is work piece 10 after formation of seed layers 36, 38, 40, and 42 over insulating layer 26, in vias 28, 30, 32, and 34, respectively, and in contact with contacts 18, 20, 22, and 24, respectively. Seed layers 36, 38, 40, and 42 are formed in conventional seed layer fashion by depositing a thin metal layer that is then selectively etched using conventional mask and etch techniques. Vias may be about 100 microns, but they can also vary significantly from that.

Figure 4:
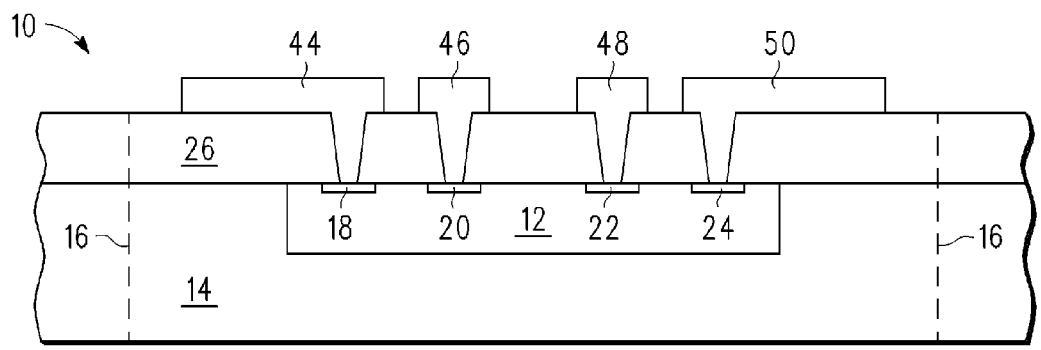
FIG. 4 is a cross-section of the work piece of FIG. 3 at a subsequent stage in processing.

Shown in FIG. 4 is work piece 10 after performing metal deposition by plating that causes the formation of conductive layers 44, 46, 48, and 50 where seed layers 36, 38, 40, and 42, respectively, were present.

Figure 5:
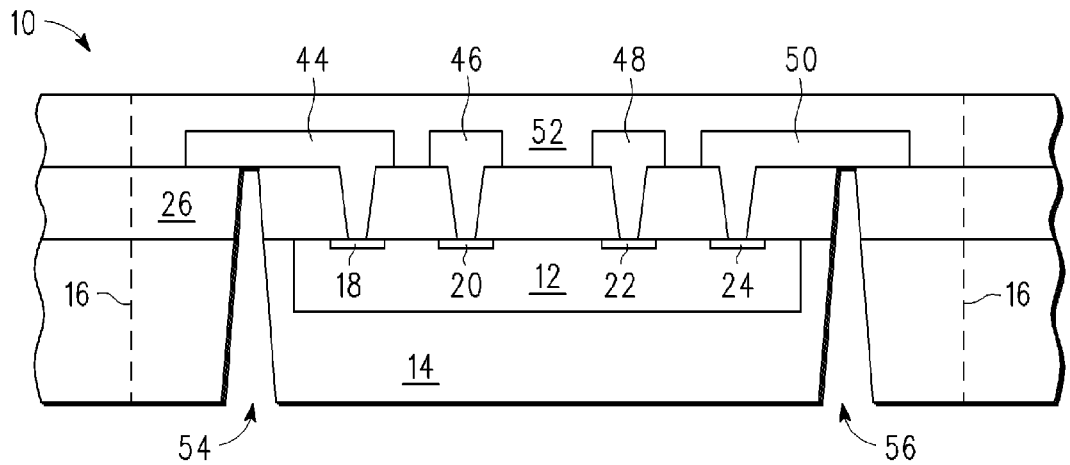
FIG. 5 is a cross-section of the work piece of FIG. 4 at a subsequent stage in processing.

Shown in FIG. 5 is work piece 10 after forming, preferably by deposition, an insulating layer 52 over the top surface of semiconductor device 12. Insulating layer 52 extends over the whole singulation area, insulating layer 26 and conductive layers 44, 46, 48, and 50. After depositing insulating layer 52, work piece 10 is turned over and vias 54 and 56 are formed through insulating layers 14 and 16 to expose conductive layers 44 and 50, respectively, as viewed looking toward the bottom surface of semiconductor device 12.

Figure 6:
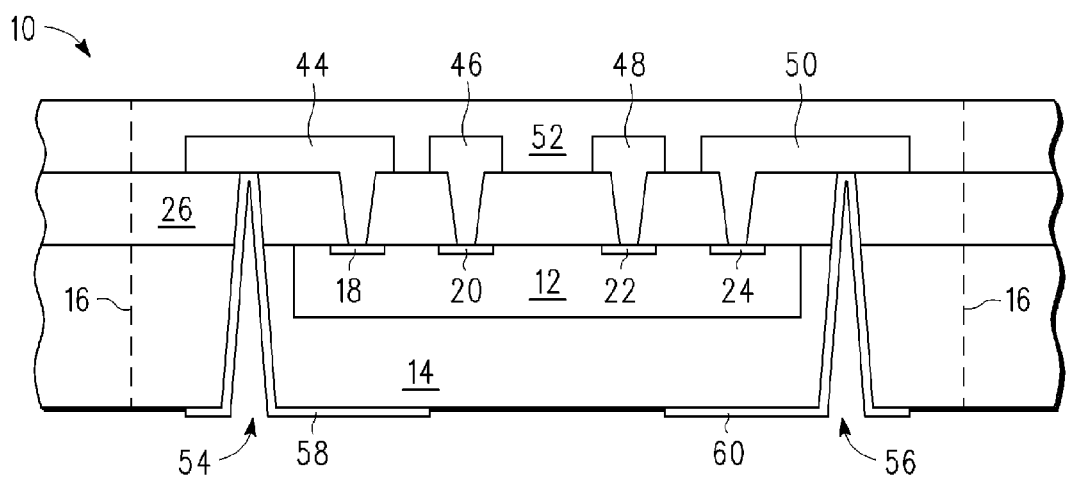
FIG. 6 is a cross-section of the work piece of FIG. 5 at a subsequent stage in processing.

Shown in FIG. 6 is work piece 10 after forming seed layers 58 and 60 on insulating layer 14, in vias 54 and 56, respectively, and in contact with conductive layers 44 and 50, respectively.

Figure 7:
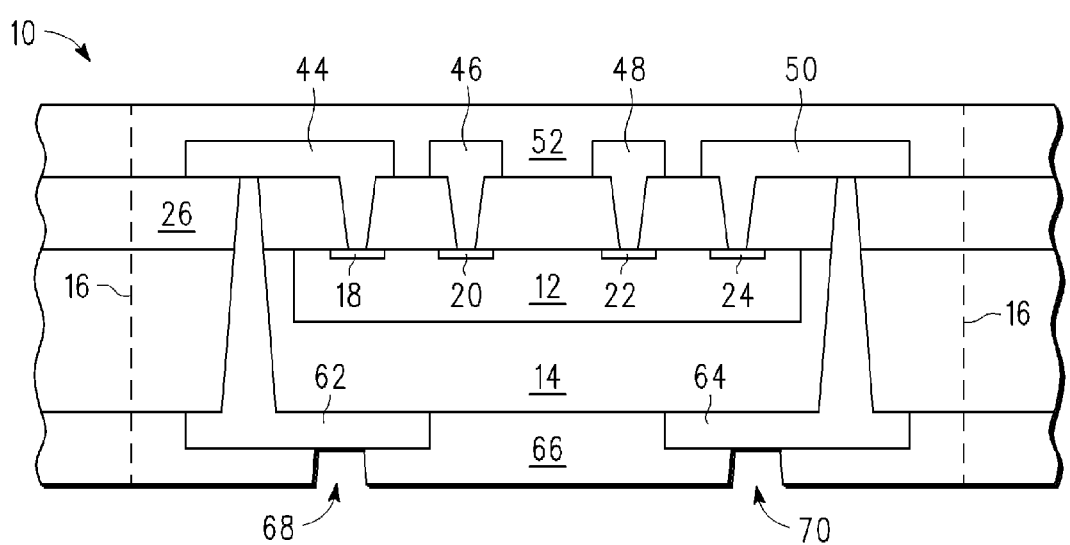
FIG. 7 is a cross-section of the work piece of FIG. 6 at a subsequent stage in processing.

Shown in FIG. 7 is work piece 10 after forming conductive layers 62 and 64 where seed layers 58 and 60 were present, forming an insulating layer 66 in the whole of singulation area over insulating layer 14 and conductive layers 62 and 64, and forming vias 68 and 70 through insulating layer 66 to expose conductive layers 62 and 64, respectively. Formation of vias 68 and 70 could be delayed until later in the process.

Figure 8:
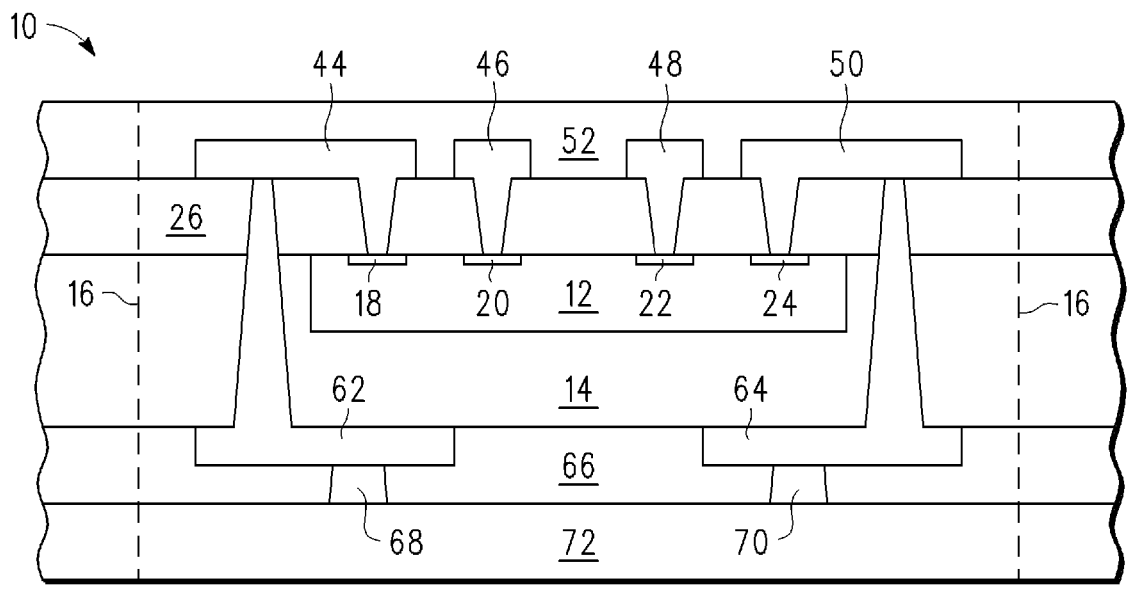
FIG. 8 is a cross-section of the work piece of FIG. 7 at a subsequent stage in processing.

Shown in FIG. 8 is work piece 10 after applying a tape 72 over insulating layer 66 and vias 68 and 70 to protect conductive layers 62 and 64 during subsequent processing. Work piece 10 is then turned over for processing above the top surface of semiconductor device 12.

Figure 9:
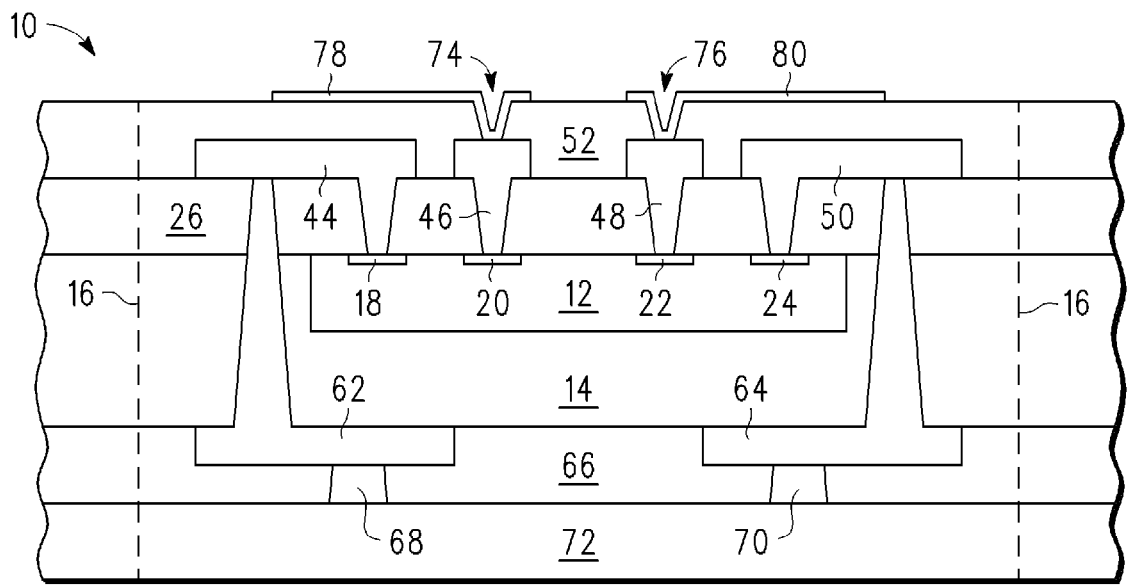
FIG. 9 is a cross-section of the work piece of FIG. 8 at a subsequent stage in processing.

Shown in FIG. 9 is work piece 10 after forming vias 74 and 76 to expose conductive layers 46 and 48, respectively, and seed layers 78 and 80 over insulating layer 52, in vias 74 and 76, respectively, and in contact with conductive layers 46 and 48, respectively.

Shown in FIG. 10 is work piece 10 with a prefabricated connector 82 having pins 84 and 86 placed in contact with seed layers 78 and 80, respectively. In this example, seed layers 78 and 80 are extended sufficiently from vias 74 and 76 for pins 84 and 86 to be sure of being able to be placed on conductive layers 84 and 86. If pins 84 and 86 can be ensured of having sufficient certainty of their position, an alternative is for vias 74 and 76 to be made sufficiently large to receive pins 84 and 86. A prefabricated connector is meant in this context to be a unit that is able to provide electrical connection between two sides of the connector in which at least one side is able to provide physical support to sustain the electrical contact by friction, pressure, or some other easily reversible means with another connector. Thus, a bonding technique such as using solder, for example, is not needed to sustain the connector to connector contact. As shown in FIG. 10, a protective cap 88 covers the electrical contacts of the region of connector 82 that also has the physical support for sustaining electrical contact.

Figure 11:
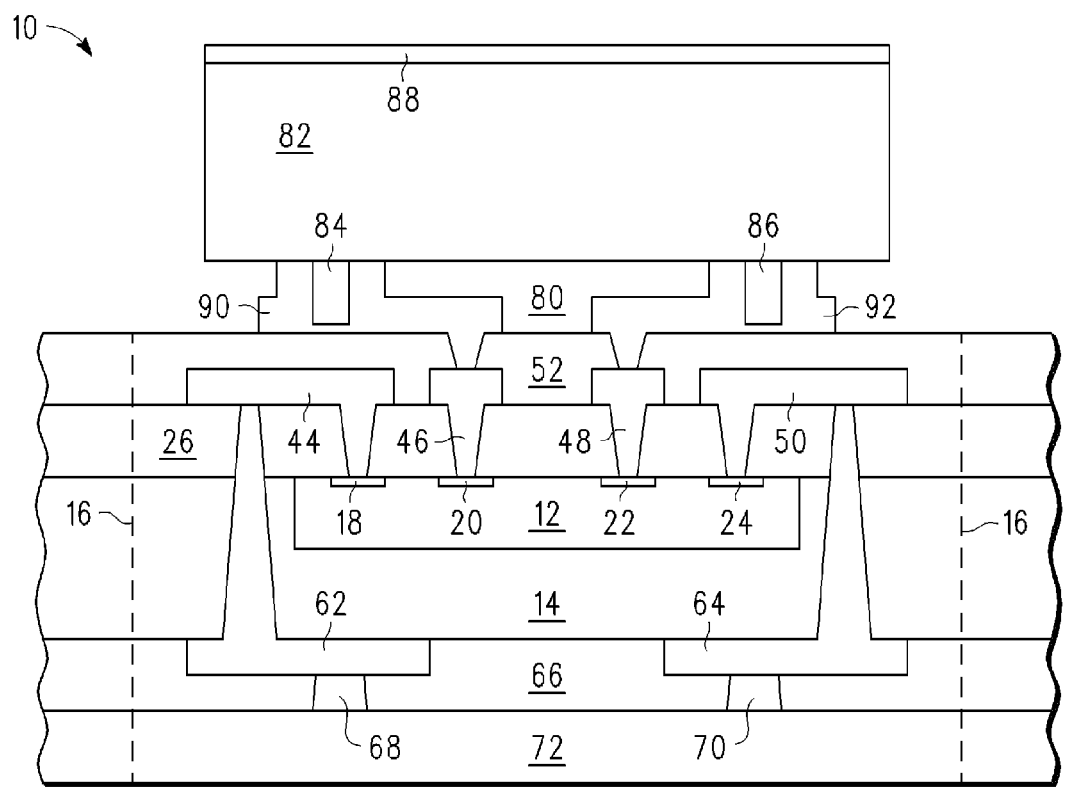
FIG. 11 is a cross-section of the work piece of FIG. 10 at a subsequent stage in processing.

Shown in FIG. 11 is work piece 10 after performing a plating step which has the effect of depositing metal on seed layers 78 and 80 and pins 84 and 86 to form conductive layers 90 and 92 on seed layers 78 and 80 respectively, and around pins 84 and 86, respectively. As an alternative, a portion of pins 84 and 86 adjacent to a body portion of connector 82 could be coated with an insulator so that the plating would not extend to the body of the connector. Depending on the connector, it may be advantageous for reliability reasons to space the plating from the body of the connector.

Figure 12:
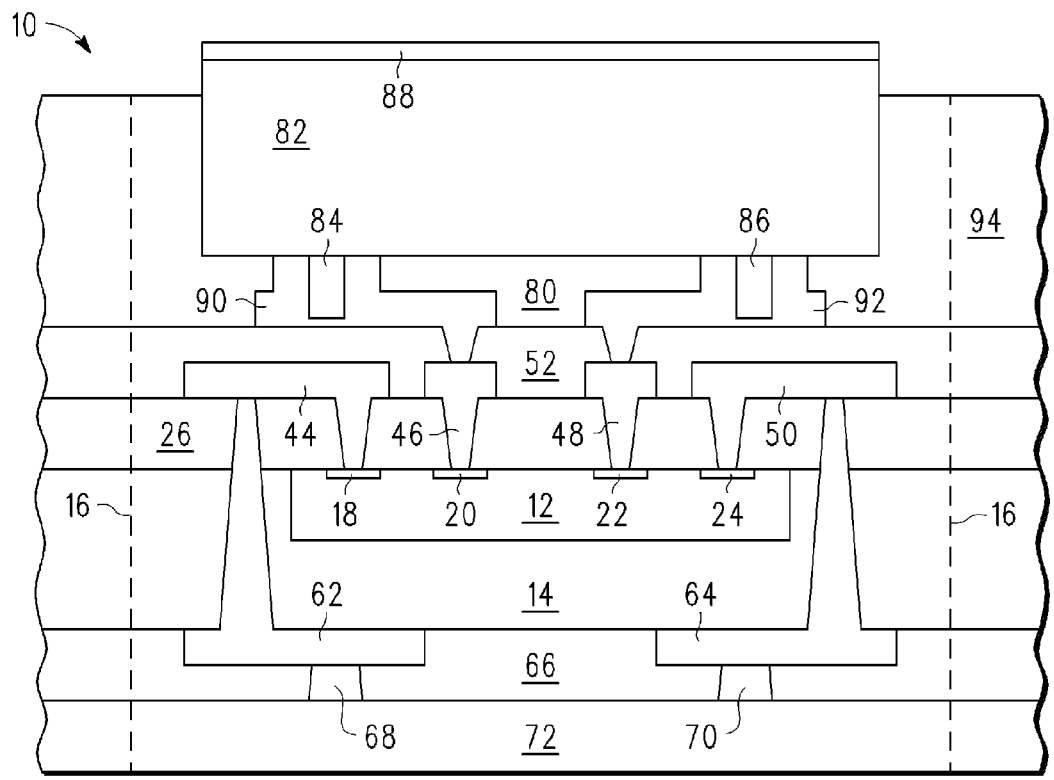
FIG. 12 is a cross-section of the work piece of FIG. 11 at a subsequent stage in processing.

Shown in FIG. 12 is work piece 10 after deposition of an insulating layer 94 in the whole singulation area over insulating layer 52 and conductive layers 90 and 92 and along sides of connector 82. This protects conductive layers 90 and 92 and provides physical support for holding connector 82 in place.

Figure 13:
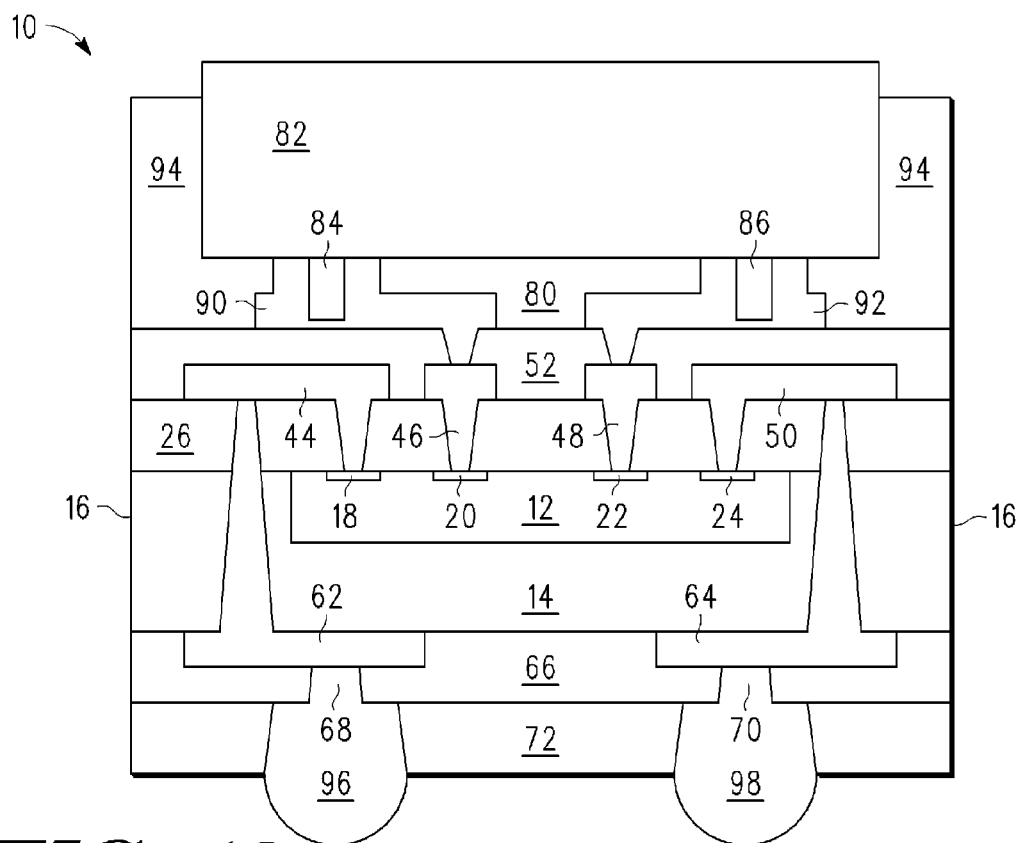
FIG. 13 is a cross-section of the work piece of FIG. 12 at a subsequent stage in processing.

Shown in FIG. 13 is work piece 10 after removing tape 72, forming solder balls 96 and 98 in contact with conductive layers 62 and 64, respectively, performing singulation, and removing protective cap 88. Work piece 10 is then ready for mounting in an electronic product. Protective cap may be left on connector 82. In plating the preferred metal is copper both for the seed and the plating. In the case of forming solder balls it may be beneficial to provide an intervening layer, such as nickel-gold (NiAu) or a sacrificial protective coating, on the copper prior to forming solder balls such as solder balls 96 and 98.

Figure 14:
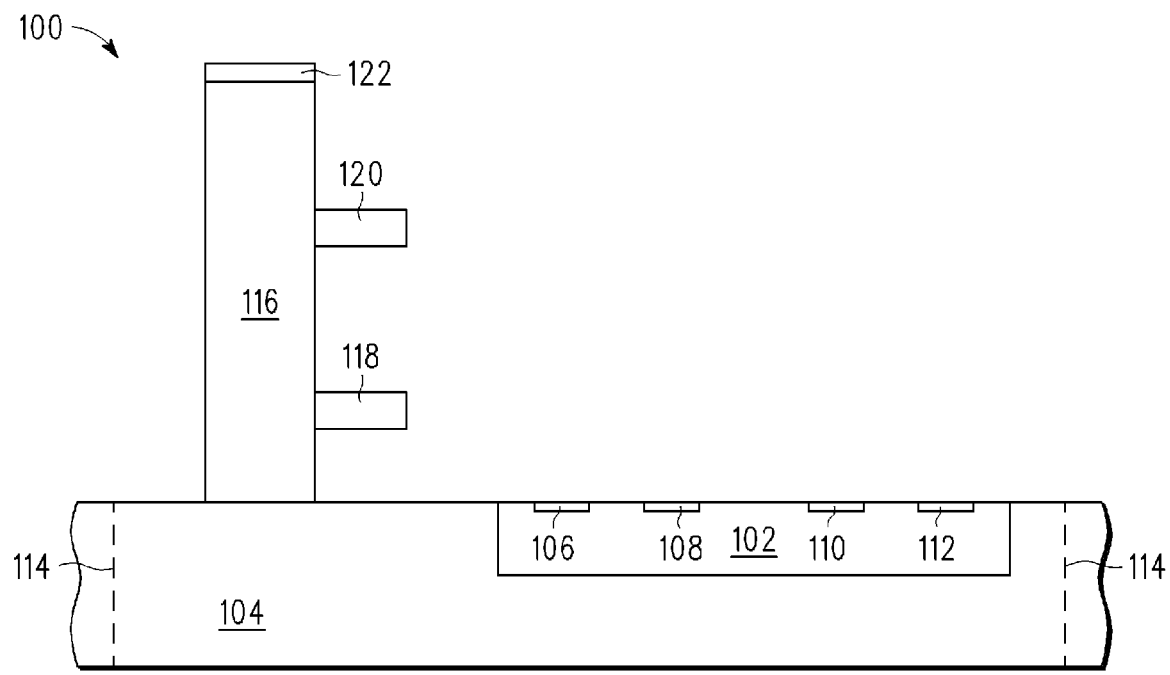
FIG. 14 is a cross-section of a work piece having a semiconductor device at a stage in processing according to another embodiment.

Shown in FIG. 14 is a work piece 100 comprising a semiconductor device 102 surrounded on all but a top side by an insulating layer 104 and a connector 116 resting on a portion of insulating layer 104 that is between semiconductor device 102 and singulation line 114. Connector 116 is adhesively held, by tape for example, to insulating layer 104. Also shown, by dotted lines 114, is a singulation boundary that defines a singulation area. Semiconductor device has contacts 106, 108, 110, and 110 exposed on a top surface. Connector 116 has pins 118 and 120 above insulating layer 104 extending laterally from its body. Pin 120 is higher from the top surface of insulating layer 104 than pin 118. A protective cover 122 covers electrical contacts on the side of connector 116 that has the physical support for sustaining electrical contact.

Figure 15:
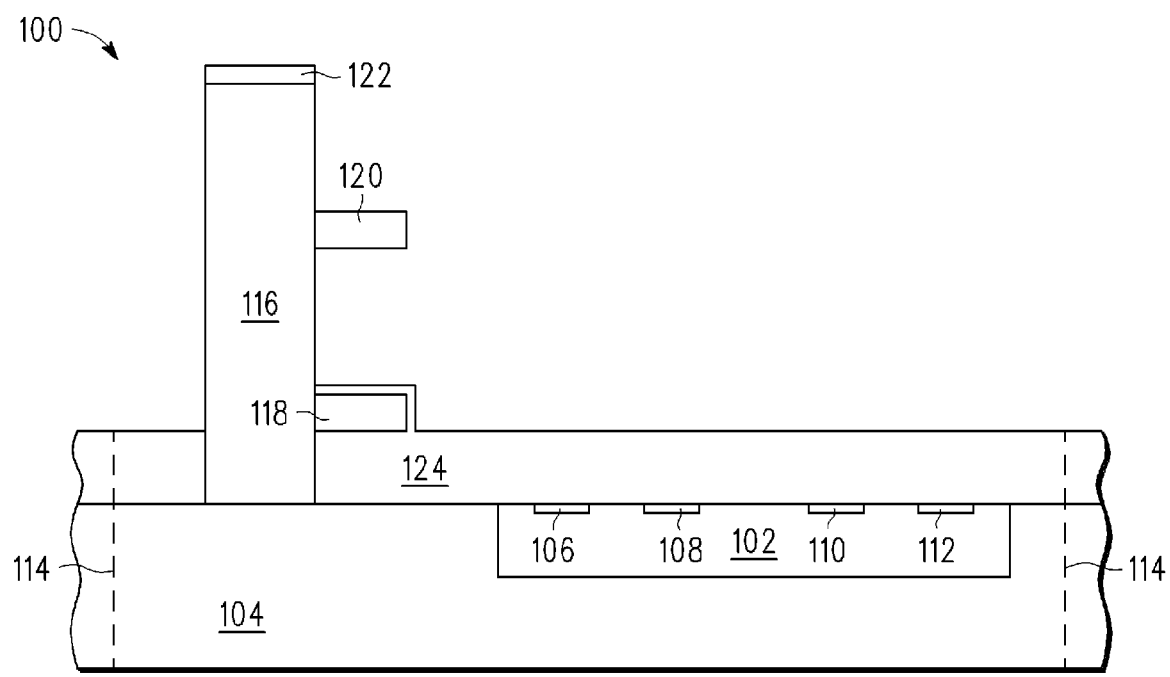
FIG. 15 is a cross-section of the work piece of FIG. 14 at a subsequent stage in processing.

Shown in FIG. 15 is work piece 100 after depositing an insulating layer 124 over the top surface of semiconductor device 102, over insulating layer 104, and and around connector 124. Insulating layer 124 provides physical support for connector 116. Insulating layer 124 is about as thick as pin 118 is above insulating layer 104. In the deposition process a thin layer of insulating layer 124 is likely to be over pin 118. It may be beneficial at this point to perform an isotropic etch, without a mask, to remove the portion of insulating layer that is on pin 118. This would reduce the thickness of insulating layer 124 but the initial thickness of insulating layer 124 could be chosen to take the etch-back into account.

Figure 16:
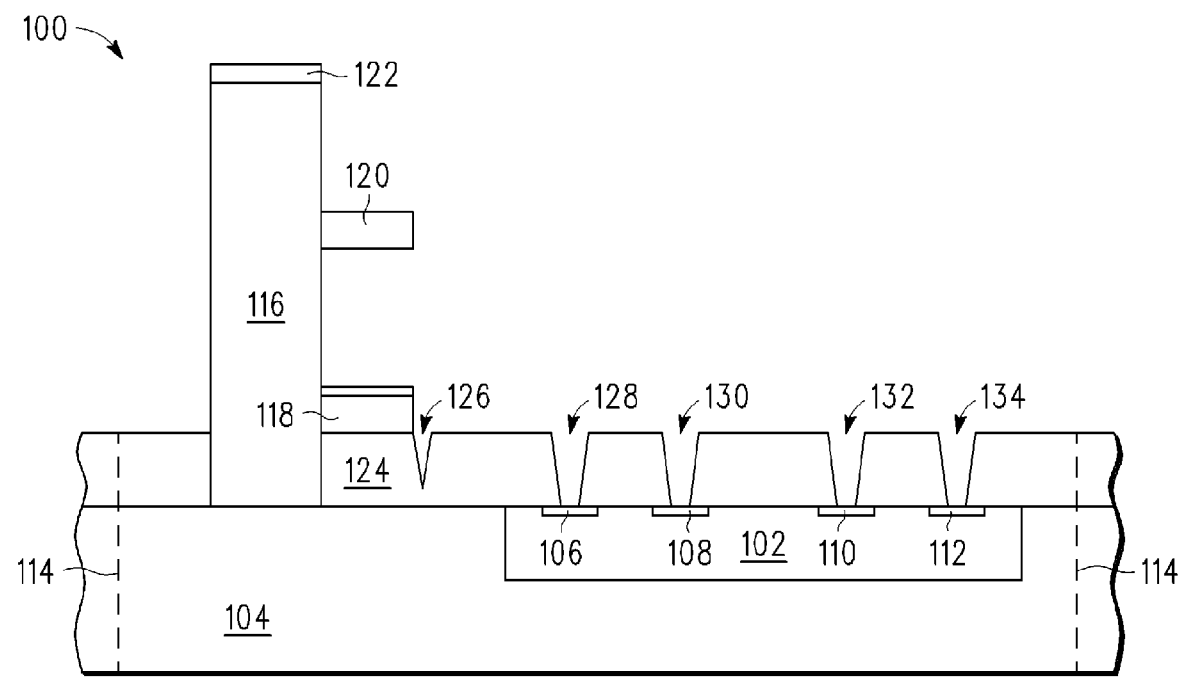
FIG. 16 is a cross-section of the work piece of FIG. 15 at a subsequent stage in processing.

Shown in FIG. 16 is work piece 100 after forming vias 128, 130, 132, and 134 through insulating layer 124 to expose contacts 106, 108, 110, and 112. Also during via formation, sides of pin 118 are exposed to ensure that insulating layer 124 is removed from those sides so that electrical contact to pin 118 can be made. In this example, pin 120 is aligned with pin 118 to make removal of insulating layer 124 over pin 118 difficult. A connector with pins being vertically offset would allow for convenient removal of insulating layer 124 from the top side of pin 124. To ensure that the sides of pin 124 are exposed some etching into insulating layer 124 occurs resulting in a hole 126 adjacent to the sides of pin 118. This hole may extend to the insulating layer 104 but simply reaches insulating layer 104.

Figure 17:
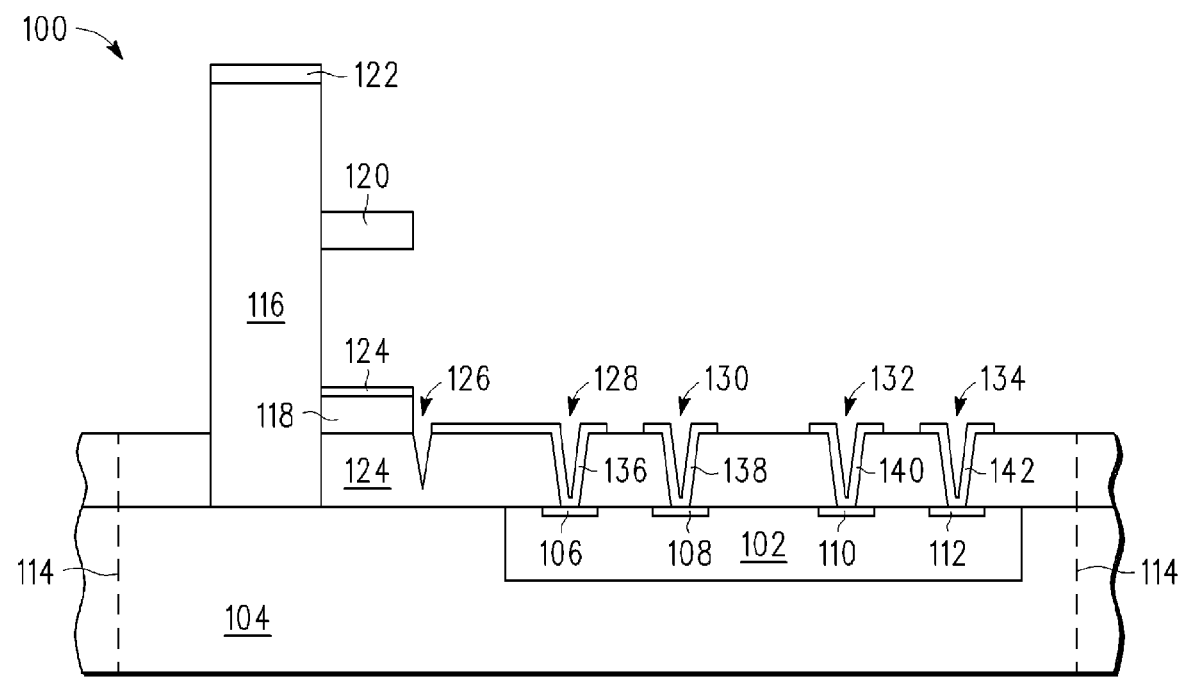
FIG. 17 is a cross-section of the work piece of FIG. 16 at a subsequent stage in processing.

Shown in FIG. 17 is work piece 100 after formation of seed layers 136, 138, 140, and 142 over insulating layer 124, in vias 128, 130, 132, and 134, respectively, and in contact with contacts 106, 108, 110, and 112, respectively. Seed layer 136 extends to pin 118 including its sides.

Figure 18:
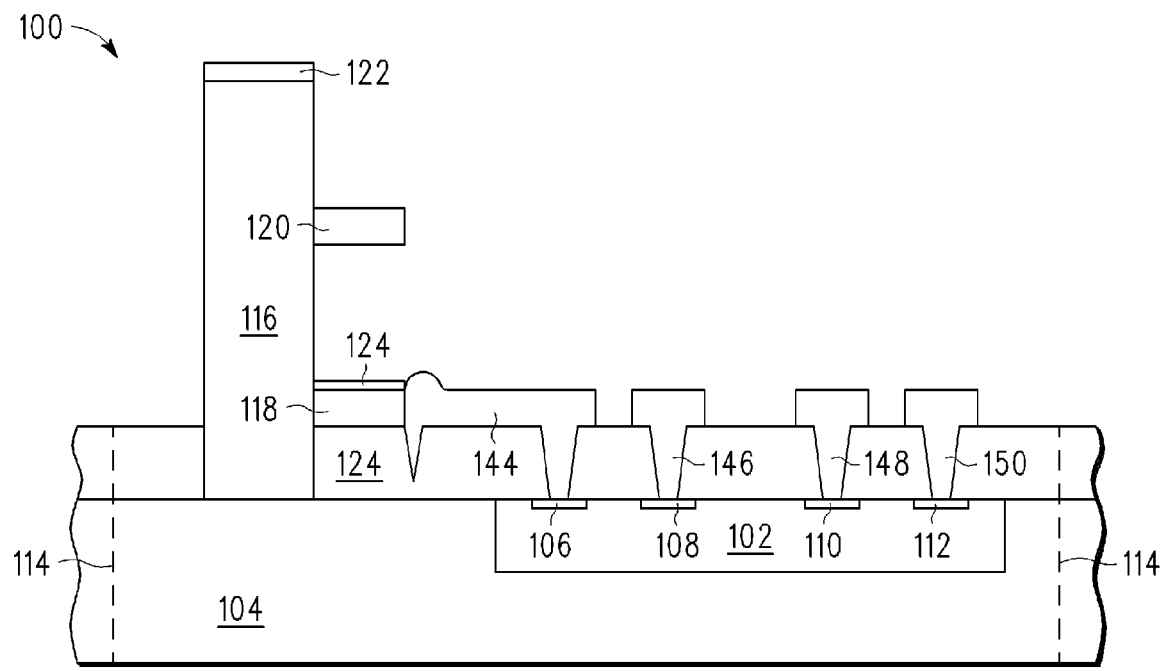
FIG. 18 is a cross-section of the work piece of FIG. 17 at a subsequent stage in processing.

Shown in FIG. 18 is work piece 100 after plating to form conductive layers 144, 146, 148, and 150 where seed layers 136, 138, 140, and 142, respectively, were present. This shows that conductive layer 144 is in contact with pin 118.

Figure 19:
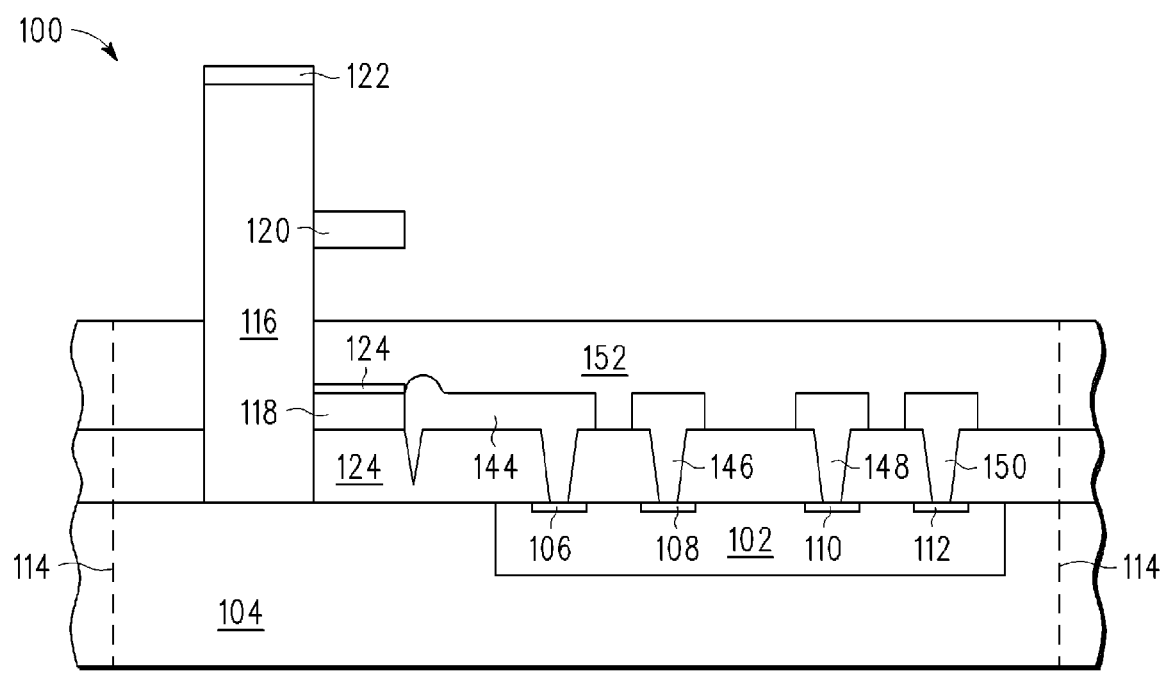
FIG. 19 is a cross-section of the work piece of FIG. 18 at a subsequent stage in processing.

Shown in FIG. 19 is work piece 100 after formation of an insulating layer 152 over conductive layers 144, 146, 148, and 150, over insulating layer 124, and around connector 116. Insulating layer 152 provides support for connector 116.

Figure 20:
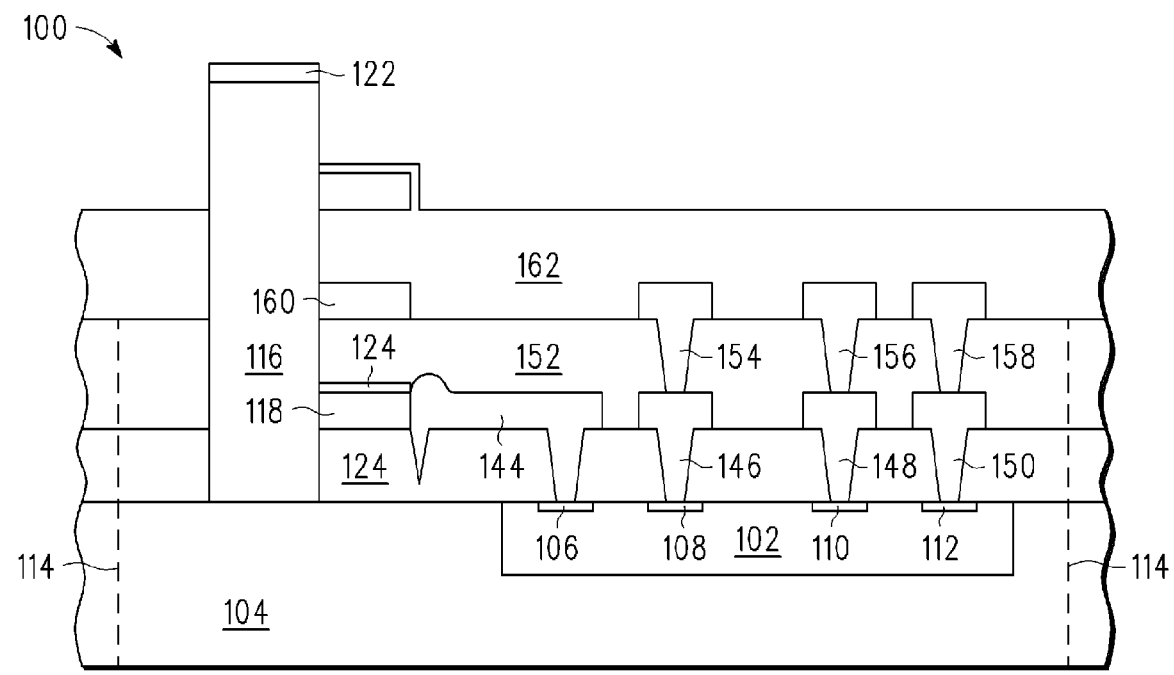
FIG. 20 is a cross-section of the work piece of FIG. 19 at a subsequent stage in processing.

Shown in FIG. 20 is work piece after formation of conductive layers 154, 156, and 158 in contact with conductive layers 146, 148, and 150, respectively, This is achieved as previously described by forming via and seed layers followed by plating. In this example, there is likely to also be formed a conductive layer 160 under pin 120 due to shadowing from pin 120 during lithography that exposes the mask for selective removal of portions of the seed layer. Conductive layer 160 is surrounded by insulation and should not have an adverse impact on electrical performance. Also shown in FIG. 20 is work piece 100 after formation of insulating layer 162 over insulating layer 152, over conductive layers 154, 156, and 158, and around connector 116. Insulating layer 162 provides physical support for connector 162. This also shows a portion of insulating layer 162 over pin 120. As for pin 118, this portion insulating layer 162 could be removed by an isotropic etch.

Figure 21:
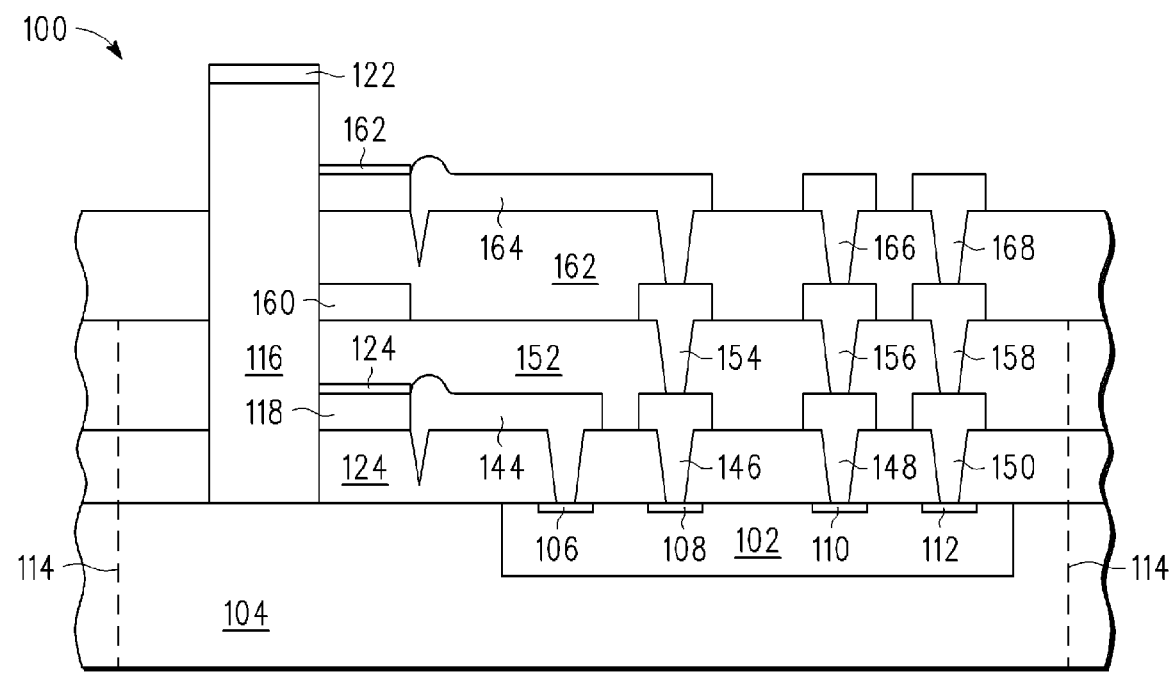
FIG. 21 is a cross-section of the work piece of FIG. 20 at a subsequent stage in processing.

Shown in FIG. 21 is work piece 100 after formation of conductive layer 164 in contact with pin 120 analogous to conductive layer 144 being in contact with pin 118. Also shown are conductive layers 166 and 168 in contact with conductive layers 156 and 158, respectively.

Figure 22:
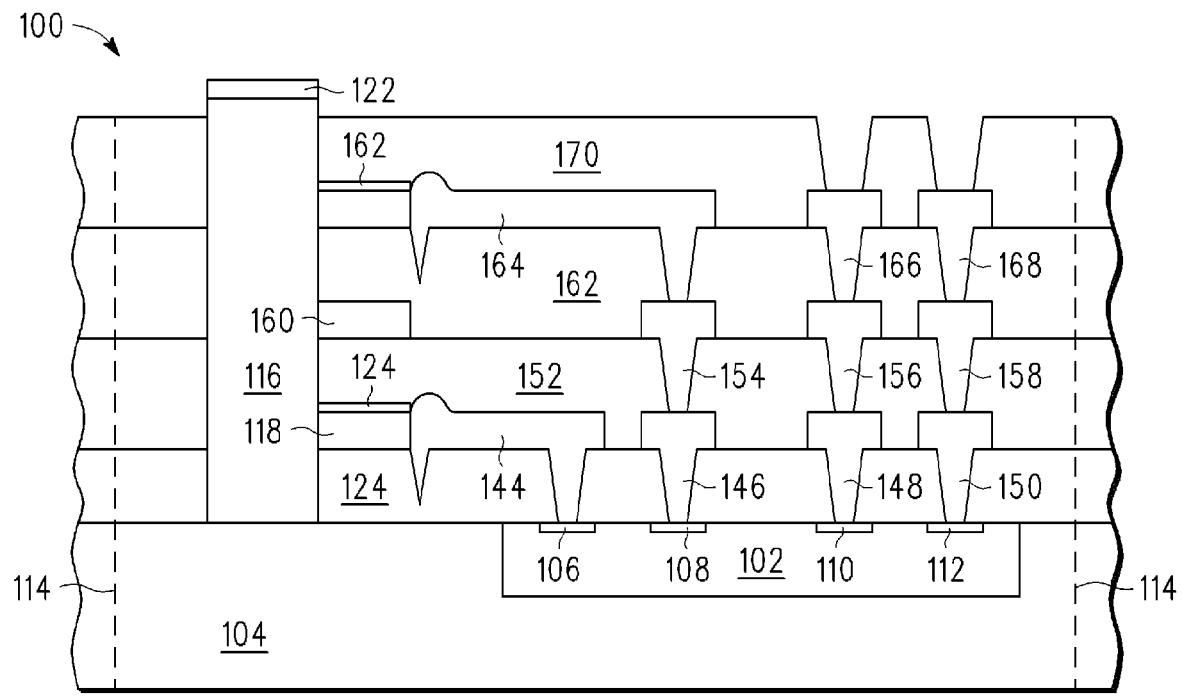
FIG. 22 is a cross-section of the work piece of FIG. 21 at a subsequent stage in processing.

Shown in FIG. 22 is work piece 100 after formation of insulating layer 170 over conductive layers 164, 166, and 168, over insulating layer 162, and around connector 116. Also shown are via openings to expose conductive layers 166 and 168.

Figure 23:
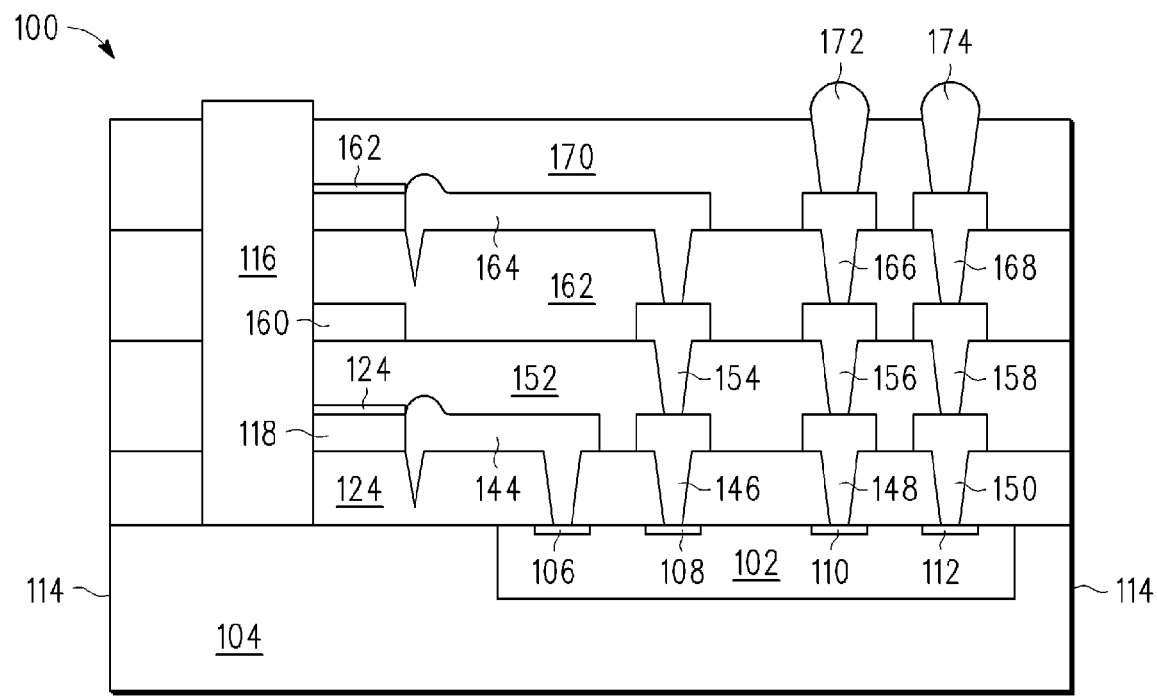
FIG. 23 is a cross-section of the work piece of FIG. 15 at a subsequent stage in processing.

Shown in FIG. 23 is work piece 100 after formation of solder balls 172 and 174 in contact with conductive layers 166 and 168, respectively, singulation on lines 114, and removal of protective cap 122. In this case, conductive layers 166 and 168 have an exposed portion that can be considered solderable contacts and are on the same side as the connector. The conductive layers could be done in the same manner as shown in FIGS. 1-13 so that the solderable contacts, with a connector embedded in a resulting packaged integrated circuit as connector 116, could be on the opposite side from the connector. Similarly, work piece 10 of FIG. 13 could have the solderable contacts on the same side as the connector formed in the manner shown in FIGS. 14-23. Also the connector and solderable contacts can be reversed from that shown. Thus, the connectors, either 116 or 82, could be on the bottom side of the die instead of the top side as shown.

Thus, it is shown that a prefabricated connector can be embedded in a resulting packaged integrated circuit in which the connector is electrically connected to the semiconductor device and also that solderable contacts, ones available external to the work piece, are connected to the semiconductor device.

In the foregoing specification, the invention has been described with reference to specific embodiments. However, one of ordinary skill in the art appreciates that various modifications and changes can be made without departing from the scope of the present invention as set forth in the claims below. For example, the connectors are shown as having straight edges but the connectors may have serrated edges or otherwise have lateral extensions that provide additional anchoring by the insulating layers. As another example, the connector may be a pre-fabricated multi-contact polymeric connector. Accordingly, the specification and figures are to be regarded in an illustrative rather than a restrictive sense, and all such modifications are intended to be included within the scope of the present invention.

Benefits, advantages, solutions to problems, and any element(s) that may cause any benefit, advantage, or solution to occur or become more pronounced are not to be construed as a critical, required, or essential feature or element of any or all the claims. The terms "a" or "an", as used herein, are defined as one or more than one even if other elements are clearly stated as being one or more in the claims or specification. The term "plurality", as used herein, is defined as two or more than two. The term another, as used herein, is defined as at least a second or more. The term "coupled", as used herein, is defined as connected, although not necessarily directly, and not necessarily mechanically. Moreover, the terms "front", "back", "top", "bottom", "over", "under", "side", and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

The invention claimed is:

1. A method of packaging a first device having a first major surface (top) and a second major surface (bottom), comprising:
    forming a first layer over the second major surface of the first device and around sides of the first device and leaving the first major surface of the first device exposed, wherein the first layer is selected from the group consisting of an encapsulant and a polymer;
    forming a first dielectric layer over the first major surface of the first device;
    forming a via in the first dielectric layer;
    forming a seed layer within the via and over a portion of the first dielectric layer;
    obtaining a prefabricated connector;
    physically coupling the prefabricated connector having a contact portion to the seed layer; and
    plating a conductive material over the seed layer to form a first interconnect in the via and over a portion of the first dielectric layer and around a portion of the contact portion of the prefabricated connector.

2. The method of claim 1, further comprising
    forming a second dielectric layer over the first device before forming the first dielectric layer;
    forming a second interconnect in the second dielectric layer, wherein the second interconnect is coupled to the first interconnect; and forming a third interconnect in the second dielectric layer, wherein the third interconnect is coupled to an external connector.

3. The method of claim 2, wherein the external connection comprises solder balls.

4. The method of claim 2, wherein the external connector is formed over the first major surface of the first device and the connector is formed over the first major surface of the first device.

5. The method of claim 2, wherein the external connector is over the second major surface of the first device and the connector is formed over the first major surface of the first device.

6. The method of claim 1, wherein physically coupling a connector to the seed layer comprises placing the connector over the first major surface of the first device, wherein the first major surface of the first device comprises contacts.

7. The method of claim 1, wherein physically coupling a connector to the seed layer comprises placing the connector over the second major surface of the first device, wherein the first major surface of the first device comprises contacts.

8. The method of claim 1, wherein physically coupling a connector to the seed layer comprises: placing the connector over the first layer, wherein:
- the first layer comprises a first portion adjacent a second portion;
- the first device is formed in the first portion of the first layer;
- the connector is placed over the second portion of the first layer;
- the connector comprises a side contact; and
- the side contact is coupled to the seed layer.

9. The method of claim 8, wherein the side contact is selected from the group consisting of a female connector and a male connector.

* * * * *